(12) United States Patent
Huang et al.

(10) Patent No.: US 10,386,228 B2
(45) Date of Patent: Aug. 20, 2019

(54) SYSTEM FOR MEASURING LIGHT INTENSITY DISTRIBUTION

(71) Applicants: Tsinghua University, Beijing (CN); HON HAI PRECISION INDUSTRY CO., LTD., New Taipei (TW)

(72) Inventors: Lei Huang, Beijing (CN); Jun Zhu, Beijing (CN); Guo-Fan Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/853,855

(22) Filed: Dec. 25, 2017

(65) Prior Publication Data

US 2018/0306642 A1 Oct. 25, 2018

(30) Foreign Application Priority Data

Apr. 24, 2017 (CN) .......................... 2017 1 0271505

(51) Int. Cl.
| | |
|---|---|
| G01J 1/00 | (2006.01) |
| G01J 1/42 | (2006.01) |
| G01J 1/08 | (2006.01) |
| G01J 1/04 | (2006.01) |
| H01J 37/26 | (2006.01) |
| G01J 1/02 | (2006.01) |
| G01J 5/02 | (2006.01) |
| G01J 5/08 | (2006.01) |
| G01J 1/58 | (2006.01) |
| G01J 5/06 | (2006.01) |

(52) U.S. Cl.
CPC ........... *G01J 1/4257* (2013.01); *G01J 1/0242* (2013.01); *G01J 1/0411* (2013.01); *G01J 1/08* (2013.01); *G01J 1/4228* (2013.01); *G01J 1/58* (2013.01); *G01J 5/023* (2013.01); *G01J 5/061* (2013.01); *G01J 5/0853* (2013.01); *H01J 37/26* (2013.01)

(58) Field of Classification Search
CPC .......... G01J 1/0242; G01J 1/0411; G01J 1/08; G01J 1/4228; G01J 1/4257; G01J 1/58; G01J 5/023; G01J 5/061; G01J 5/0853; H01J 37/26
USPC ................................. 356/431–448, 213–236
See application file for complete search history.

(56) References Cited

U.S. PATENT DOCUMENTS

| | | |
|---|---|---|
| 6,626,835 B1 | 9/2003 | Kraus |
| 8,981,319 B2 | 3/2015 | Zhu et al. |

(Continued)

FOREIGN PATENT DOCUMENTS

| | | |
|---|---|---|
| DE | 102012210851 | 1/2014 |
| TW | I504865 | 10/2015 |
| TW | 201702782 A | 1/2017 |

*Primary Examiner* — Tri T Ton
(74) *Attorney, Agent, or Firm* — ScienBiziP, P.C.

(57) ABSTRACT

A light intensity distribution comprises a carbon nanotube array located on a surface of a substrate, a reflector, an imaging element and a cooling device. The carbon nanotube array absorbs photons from a light source and radiates a visible light. The reflector reflects the visible light and is spaced from the carbon nanotube array. The imaging element images the visible light reflected by the reflector. The cooling device is used to cool the substrate to make a contact surface between the substrate and the carbon nanotube array maintain a constant temperature. The cooling device is located between the substrate and the imaging device. The imaging device is spaced from the cooling device.

15 Claims, 7 Drawing Sheets

(56) References Cited

U.S. PATENT DOCUMENTS

2013/0327960 A1 12/2013 Zhu et al.
2018/0195898 A1 7/2018 Gold et al.

SYSTEM FOR MEASURING LIGHT INTENSITY DISTRIBUTION

CROSS-REFERENCE TO RELATED APPLICATIONS

This application claims priority to Chinese Patent Application No. 201710271505.5, filed on Apr. 24, 2017, the disclosure of which is incorporated herein by reference. This application is related to commonly-assigned application entitled, "METHOD FOR MEASURING LIGHT INTENSITY DISTRIBUTION", filed Dec. 25, 2017 Ser. No. 15/853,857. Disclosures of the above-identified applications are incorporated herein by reference.

FIELD

The present disclosure relates to a system of measuring light intensity distribution.

BACKGROUND

A intensity distribution of a light source can be measured by two types of method. In the first type, a sensor is put in a position away from the light source. The sensor is moved around a circumference of a circle with the light source at the circle center to measure a light intensity distribution. In the second type, a measuring device is put in a position away from the light source to measure the light intensity distribution. The measuring device includes an optical system with a CCD sensor and an ultra-wide-angle prism with a fisheye-like lens.

The sensor used in measuring a light intensity distribution can be classified into two types: photonic and thermal. A photonic sensor has high sensitivity and high response speed. However, the photonic sensor is expensive and cannot operate at room temperature. A thermal sensor is low-cost and can be operated at room temperature. However, the thermal sensor has low sensitivity and low response speed.

BRIEF DESCRIPTION OF THE DRAWINGS

Implementations of the present technology will now be described, by way of example only, with reference to the attached figures.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like.

Figure 1:
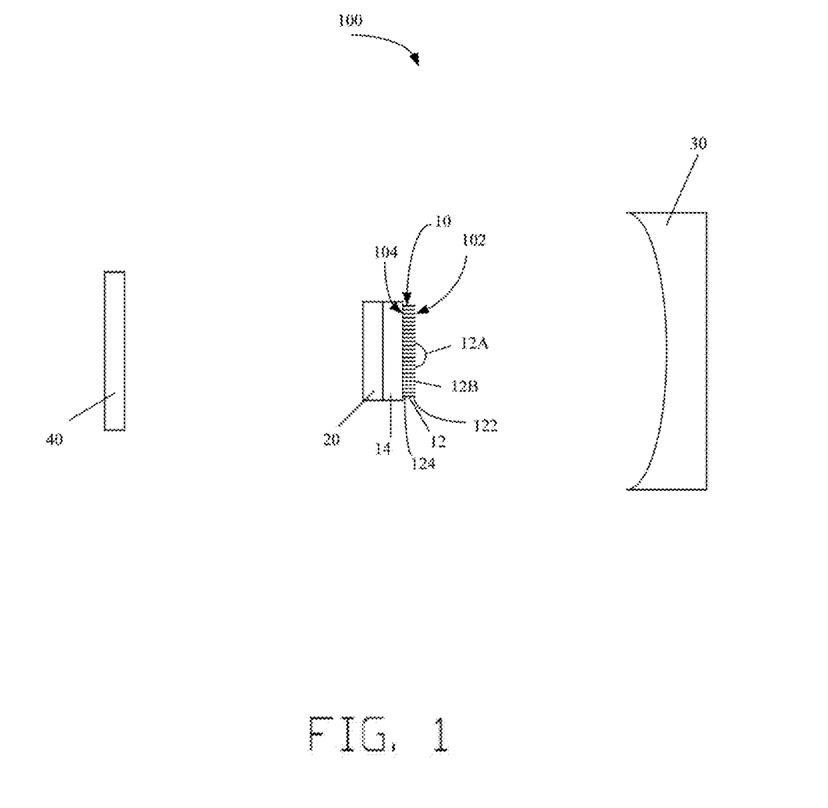
FIG. 1 is a schematic view showing a system of one embodiment for measuring light intensity distribution.

Referring to FIG. 1, one embodiment provides a system 100 for measuring light intensity distribution. The system 100 comprises a carbon nanotube array 10 located on a surface of a substrate 14, a cooling device 20, a reflector 30 and an imaging element 40. The cooling device 20 is located between the substrate 14 and the imaging device 40. The cooling device 20 is used for cooling the substrate 14 to make a contact surface between the substrate 14 and the carbon nanotube array 10 maintain a constant temperature. The reflector 30 is spaced from the carbon nanotube array 10. The carbon nanotube array 10 is located between the reflector 30 and the substrate 14. The imaging device 40 is spaced from the cooling device 20.

In one embodiment, the carbon nanotube array 10 is fabricated by a chemical vapor deposition process. The chemical vapor deposition process includes the steps of:

(S1), providing a substantially flat and smooth substrate 14, wherein the substrate 14 can be a P-type silicon substrate, an N-type silicon substrate, or a silicon substrate having oxide layer disposed thereon.

(S2), forming a catalyst layer on the surface of the substrate 14, wherein the catalyst can be made of iron, cobalt, nickel, or any combination alloy thereof.

(S3), annealing the substrate 14 with the catalyst layer at a temperature ranging from about 700° C. to about 900° C. in air for about 30 minutes to about 90 minutes;

(S4), heating the substrate 14 with the catalyst layer at a temperature ranging from about 500° C. to about 740° C. in a furnace with a protective gas therein; and (S5), supplying a carbon source gas to the furnace for about 5 minutes to about 30 minutes and growing the carbon nanotube array 10, wherein the carbon source gas may be hydrocarbon gas, such as ethylene, methane, acetylene, ethane, or any combination thereof.

Moreover, the carbon nanotube array 10 formed under the above conditions is essentially free of impurities, such as carbonaceous or residual catalyst particles.

The carbon nanotube array 10 comprises a plurality of carbon nanotubes 12 parallel to each other. The plurality of carbon nanotubes 12 may be single-walled carbon nanotubes, double-walled carbon nanotubes, multi-walled carbon nanotubes, or their combinations. A diameter of a single-walled carbon nanotube is in a range from about 0.5 nanometers (nm) to about 50 nm. A diameter of a double-walled carbon nanotube is in a range from about 1.0 nm to about 50 nm. A diameter of a multi-walled carbon nanotube is in a range from about 1.5 nm to about 50 nm. The plurality of carbon nanotubes 12 has a height of about 100 nm to about 10 millimeters (mm). For example, the height of the plurality of carbon nanotubes 12 is 100 microns, 500 microns, 1000 microns or 5 mm. In one embodiment, the substrate 14 is a circular silicon substrate, and a radius of the substrate 14 is 7.5 mm.

Figure 3:
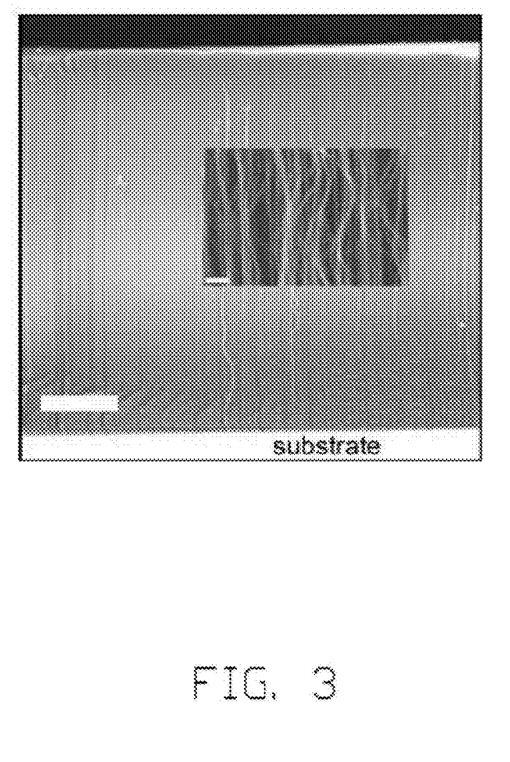
FIG. 3 shows a scanning electron microscope (SEM) image of a carbon nanotube array.

An angle between the plurality of carbon nanotubes 12 and the surface of the substrate 14 can be in a range from about 10 degrees to about 90 degrees. In one embodiment, the angle between the plurality of carbon nanotubes 12 and the surface of the substrate 14 is in a range from about 60 degrees to about 90 degrees. FIG. 3 shows that in one embodiment, the plurality of carbon nanotubes 12 is perpendicular to the surface of the substrate 14. An interspace between adjacent two of the carbon nanotubes 12 can be in a range from about 0.1 nm to about 0.5 nm. The plurality of carbon nanotubes 12 comprises a first end 122 and a second end 124 opposite to the first end 122. The first ends of the plurality of carbon nanotubes 12 are away from the substrate 14, and the second ends of the plurality of carbon nanotubes 12 connect to the surface of the substrate 14.

The carbon nanotube array 10 has a first surface 102 and a second surface 104 opposite to the top surface 102. Each of the plurality of carbon nanotubes 12 has the first end 122 and the second end 124 opposite to the first end 122. The first end 122 of each of the carbon nanotubes 12 is close to the light source. The second end 124 of each of the carbon nanotubes 12 is away from the light source and connects to the substrate 14. Each of the carbon nanotubes 12 orients along a direction from the first surface 102 to the second surface 104 of the carbon nanotube array 10.

Each of the carbon nanotubes 12 has heat conduction anisotropy. Heat is conducted along a axis of the carbon nanotubes 12 and is hardly conducted along a direction vertical to the axis of the carbon nanotubes 12. Therefore, when a light source radiates the carbon nanotube array 10, the carbon nanotube array 10 radiates a visible light, and the first surface 102 and the second surface 104 of the carbon nanotube array 10 radiates more the visible light. Side surfaces of the carbon nanotube array 10 hardly radiate visible light. The side surfaces are parallel to the axis of the carbon nanotubes 12. Only the first surface 102 radiates the visible light, because the visible light radiated by the second surface 104 is turned back by a opaque substrate 14. Therefore, the reflective 30 adjacent to and spaced form at the first surface 102 of the carbon nanotube array 10 can reflect the visible light to the imaging element 40.

The light source may be various lights, such as an infrared light or a visible light. In one embodiment, the light source is a carbon dioxide laser. A power of the carbon dioxide laser is in a range from about 2 W to about 20 W. A radius of the carbon dioxide laser is in a range from about 1.5 mm to about 2.5 mm. A wavelength of the carbon dioxide laser is in a range from about 9.6 μm to about 11 μm. In one embodiment, the power of the carbon dioxide laser is 10 W, and the wavelength of the carbon dioxide laser is in a range from about 10.6 μm.

The cooling device 20 is used for cooling the substrate 14 to make the contact surface between the substrate 14 and the carbon nanotube array 10 maintain the constant temperature. The cooling device 20 is located between the substrate 14 and the imaging element 40 and spaced apart from the imaging element 40. As long as cooling device 20 cools the substrate 14 to make the contact surface between the substrate 14 and the carbon nanotube array 10 maintain the constant temperature, the cooling device 20 may be spaced apart from the substrate 14 or be located in contact with the substrate 14. In one embodiment, the cooling device 20 is located in contact with the surface of the substrate 14 away from the carbon nanotube array 10. Thus, the cooling device 20 can rapidly reduce a temperature of the substrate 14 and rapidly achieve the effect of making the contact surface between the substrate 14 and the carbon nanotube array 10 maintain the constant temperature. The cooling device 20 may be adhered to the surface of the substrate 14 away from the carbon nanotube array 10 through a thermal conductive adhesive.

The cooling device 20 may be a device containing a cooling medium, or may be a digital temperature control device. When the cooling device 20 is the device containing the cooling medium, the device containing the cooling medium comprises a chamber, an inlet and an outlet. The chamber is used for containing the cooling medium. The inlet and the outlet are located on at least a sidewall of the chamber in a axial direction of the carbon nanotube 12. In one embodiment, the inlet and the outlet are located on a same sidewall of the chamber in a axial direction of the carbon nanotube 12. In another embodiment, the inlet and the outlet are located on opposite two sidewalls of the chamber in a axial direction of the carbon nanotube 12. The cooling medium may be a cooling liquid or a cooling gas. The cooling medium can flow from the inlet into the cooling device 20 and out of the cooling device 20 through the outlet to maintain a constant low temperature and continuously cool the substrate 14. The digital temperature control device may be a sheet-shaped structure and may be directly attached to the surface of the substrate 14 away from the carbon nanotube array 10. The digital temperature control device can precisely control and cool the substrate 14 at a required temperature. Thus, it is beneficial for making the contact surface between the substrate 14 and the carbon nanotube array 10 maintain the constant temperature. In one embodiment, the cooling device 20 is the device containing the cooling medium, and the cooling medium is cooling water.

Figure 4:
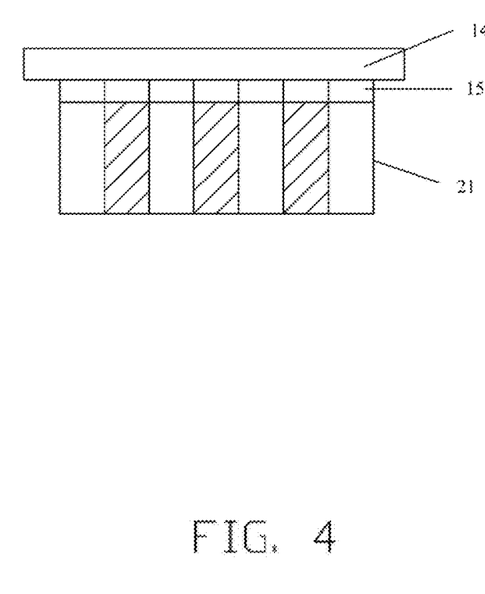
FIG. 4 is a schematic view showing a plurality of temperature sensors and a plurality of cooling units.

A plurality of temperature sensors 15 can be located on the substrate 14. The plurality of temperature sensors 15 is used for sensing a temperature of the substrate 14 at different locations in real time. The plurality of temperature sensors 15 may be located on sidewalls of the substrate 14 in the axial direction of the carbon nanotubes 12 or may be located between the cooling device 20 and the substrate 14. Referring to FIG. 4, in one embodiment, the plurality of temperature sensors 15 are located between the cooling device 20 and the substrate 14, and the cooling device 20 comprises a plurality of cooling units 21. The plurality of cooling units 21 may be in one-to-one correspondence with the plurality of temperature sensors 15 for controlling a temperature of a local location of the substrate 14. Further, the plurality of cooling units 21 and the plurality of temperature sensors 15 may not correspond one to one. The larger the number of cooling units 21 and the temperature sensors 15, the better. When the temperature sensor 15 detects changes of the temperature at one location or some locations of the substrate 14, a temperature of the cooling medium in the cooling unit 21 corresponding to the temperature sensor 15 can be adjusted to maintain the temperature of the substrate 14 in a steady state. Thus, the contact surface between the substrate 14 and the carbon nanotube array 10 can be maintained at the constant temperature. The maintaining of the temperature of the substrate 14 in a stable state means that the temperature of the substrate 14 is substantially maintained within a small temperature fluctuation range.

Different cooling temperatures may be used to make the contact surface between the substrate 14 and the carbon nanotube array 10 maintain the constant temperature according to different powers of the laser. In one embodiment, when the power of the laser is 10 W, the cooling temperature of the cooling device 20 is in a range from about −20° C. to about 0° C.

So as to avoid the cooling device 20 to affect a reflection of the light, a cross-sectional area of the cooling device 20 is less than or equal to a cross-sectional area of the substrate 14 in a light irradiation direction of the light source. In one embodiment, the cross-sectional area of the cooling device 20 is the same as the cross-sectional area of the substrate 14 in the light irradiation direction of the light source to rapidly control and reduce the temperature of the substrate 14.

Figure 5:
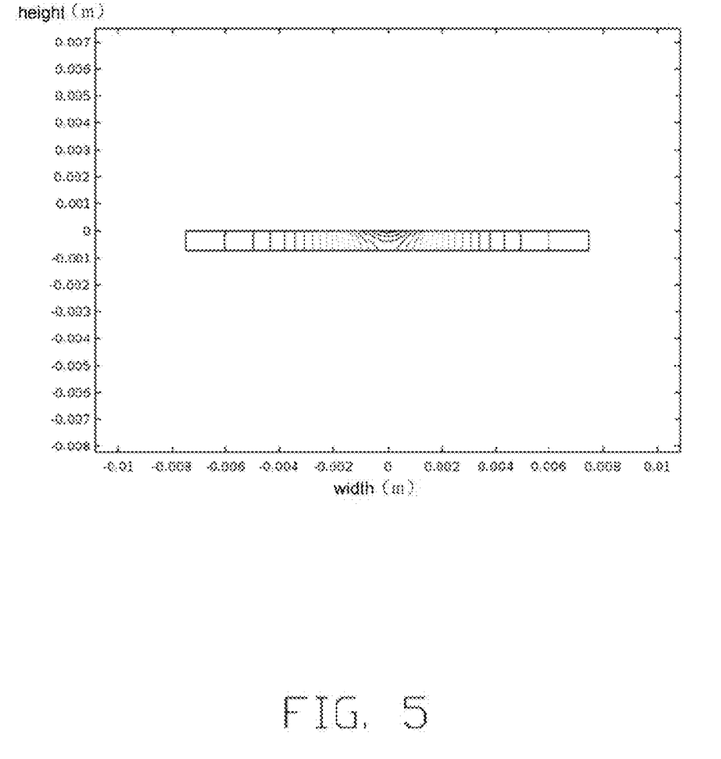
FIG. 5 is a isothermal line simulation chart of a substrate not cooled by a cooling device.
Figure 6:
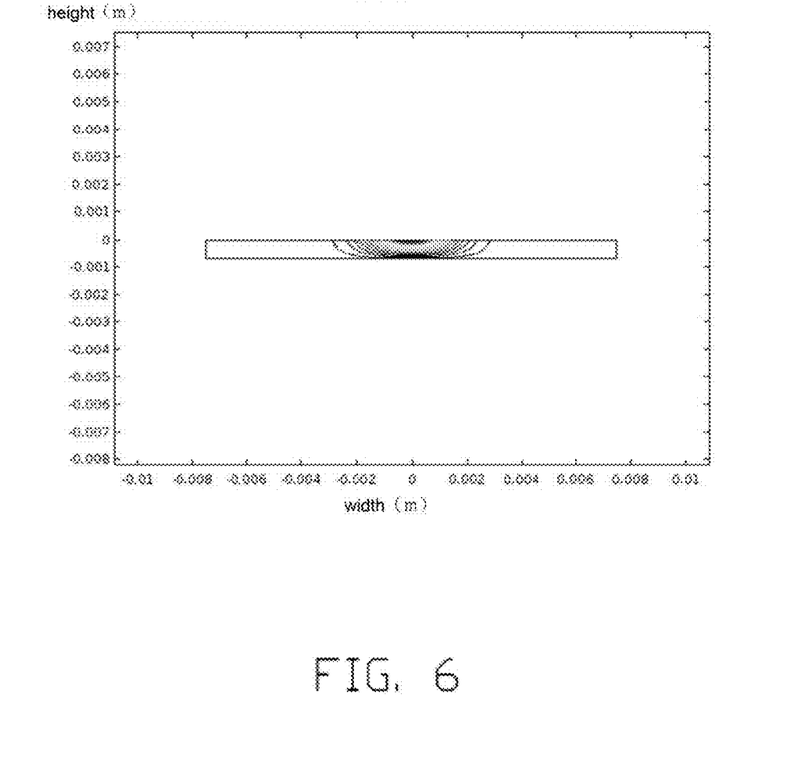
FIG. 6 is a isothermal line simulation chart of the substrate cooled by the cooling device.
Figure 7:
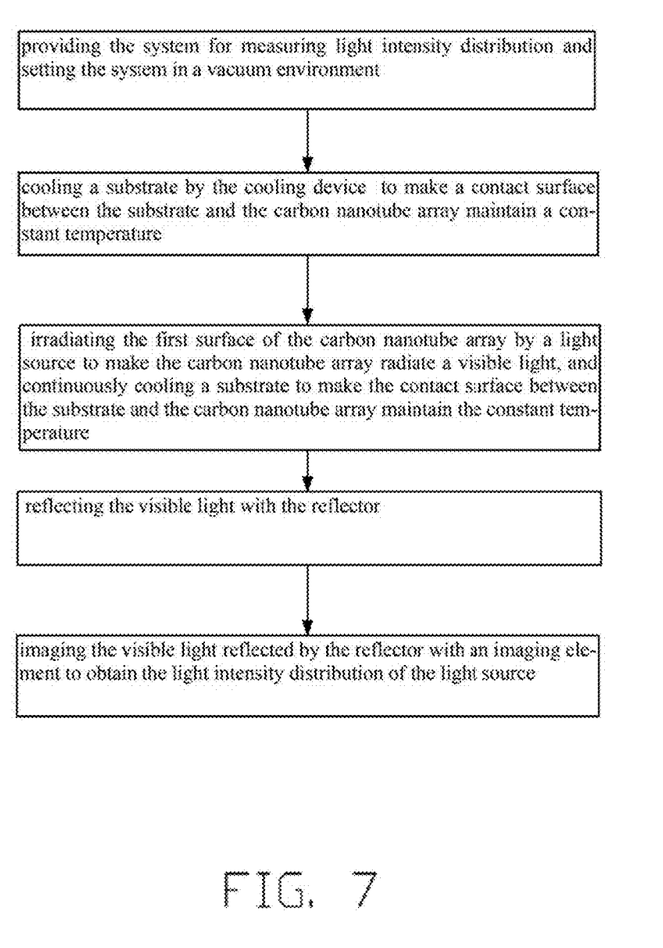
FIG. 7 is flowchart of one embodiment of a method for measuring a light intensity distribution.

When the light source irradiates the substrate 14 and the carbon nanotube array 10, the substrate 14 absorbs a heat of the light source and transversally transfers the heat to affect the light intensity distribution. Referring to FIG. 5 and FIG. 6, the cooling device 20 absorbs and removes a heat of the substrate 14 during a process of cooling the substrate 14 by the cooling device 20. The heat transversally diffused and axially diffused in the substrate 14 can be reduced to make the contact surface between the substrate 14 and the carbon nanotube array 10 maintain the constant temperature. Thus, the heat of the light source is conducted and radiated to the reflector 30 almost only along the axial direction of the carbon nanotube 12, and a accuracy of the light intensity distribution is improved.

A distance between the reflector 30 and the carbon nanotube array 10 is not limited. In one embodiment, a center of the first surface 102 of the carbon nanotube array 10 is located in a focus of the reflector 30.

A curvature radius of the reflector 30 can be in a range from about 10 mm to about 100 mm, to obtain more light. In one embodiment, the curvature radius of the reflector 30 is 88 mm, an object aperture angle of the reflector 30 is greater than or equal to 22.5 degrees, a numerical aperture of the reflector 30 is greater than 0.38. In not affecting aberration case, the distance between the reflector 30 and the carbon nanotube array 10 can be less than 80 mm, allowing the first surface 102 to be irradiated by more light.

The position of the imaging element 40 is not limited as long as the visible light reflected by the reflector 30 can be received. In one embodiment, the imaging element 40 and the reflector 30 are respectively located on and spaced from two sides of the carbon nanotube array 10. The carbon nanotube array 10 is located between the substrate 14 and the reflector 30. The substrate 14 is located between the cooling device 20 and the carbon nanotube array 10. The cooling device 20 is located between the substrate 14 and the imaging element 40.

A size of the imaging element 40 is related to the curvature radius of the reflector 30. In one embodiment, the size of the imaging element 40 is ⅓ inch, a height of the image is 3.8 mm. A field region is less than 0.01 mm, a diameter of a image defocused spot is less than 0.01 mm, 0.7 view field distortion is less than or equal to 1%, an optical transfer function in 50 line pairs/mm is great than 0.8. The method for measuring light intensity distribution can distinguish detail which has a size of great than or equal to 10 microns.

The imaging element 40 images the visible light radiated by the carbon nanotube array 10. The imaging element 40 can directly read out the light intensity distribution of the light beam 16 emitted by the light source, or read out the light intensity distribution of the light beam 16 emitted by the light source by a tool, such as a computer. The type of the imaging element 40 is not limited as long as the visible light radiated from the carbon nanotube array 10 can be imaged. The imaging element 40 can be a charge-coupled device (CCD), a complementary metal-oxide-semiconductor (CMOS). In one embodiment, the imaging element 40 is a CCD, a size of a picture element of the CCD is less than 10 microns.

Figure 2:
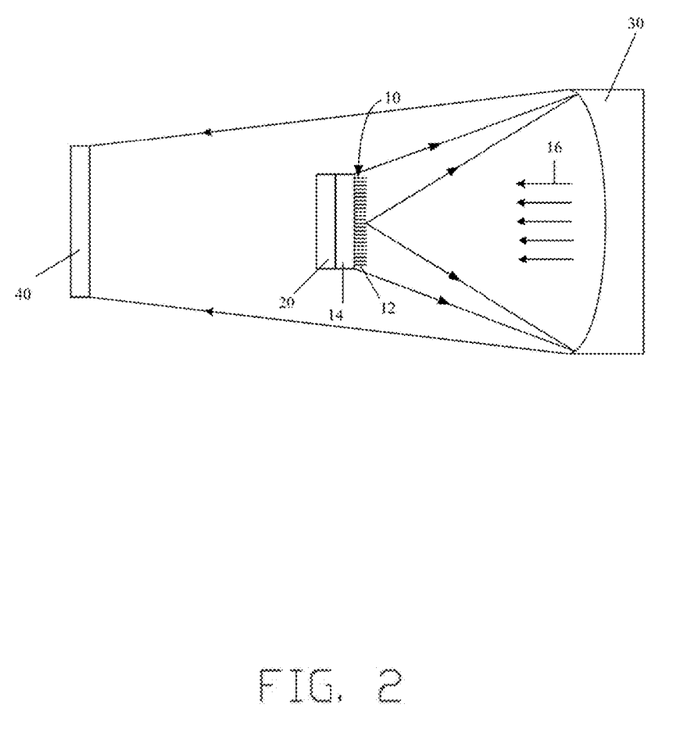
FIG. 2 is a schematic view showing an optical path with the system for measuring light intensity distribution.

Referring to FIG. 2, a method for measuring a light intensity distribution of one embodiment with the system 100 comprises the following steps:

(S21), providing the system 100 and setting the system 100 in a vacuum environment;

(S22), cooling a substrate 14 by the cooling device 20 to make a contact surface between the substrate 14 and the carbon nanotube array 10 maintain a constant temperature;

(S23), irradiating the first surface 102 of the carbon nanotube array 10 by a light source to make the carbon nanotube array 10 radiate a visible light, and continuously cooling a substrate 14 to make the contact surface between the substrate 14 and the carbon nanotube array 10 maintain the constant temperature;

(S24), reflecting the visible light with the reflector 30; and (S25), imaging the visible light reflected by the reflector 30 with an imaging element 40 to obtain the light intensity distribution of the light source.

In step (S21), the carbon nanotube array 10 comprises a plurality of carbon nanotubes 12 and has a first surface 102 and a second surface 104 opposite to the first surface 102. Each of the plurality of carbon nanotubes 12 has the first end 122 and the second end 124 opposite to the first end 122. The first end 122 of each of the carbon nanotubes 12 is close to the light source. The second end 124 of each of the carbon nanotubes 12 is away from the light source and connects to the substrate 14. Each of the carbon nanotubes 12 orients along a direction from the first surface 102 to the second surface 104 of the carbon nanotube array 10.

The substrate 14 can be a silicon substrate. The cooling device 20 is used for cooling the substrate 14 to make the contact surface between the substrate 14 and the carbon nanotube array 10 maintain the constant temperature. The cooling device 20 is located between the substrate 14 and the imaging element 40 and spaced apart from the imaging element 40. As long as the cooling device 20 cools the substrate 14 to make the contact surface between the substrate 14 and the carbon nanotube array 10 maintain the constant temperature, the cooling device 20 may be spaced apart from the substrate 14 or be located in contact with the substrate 14. In one embodiment, the cooling device 20 is located in contact with the surface of the substrate 14 away from the carbon nanotube array 10. Thus, the cooling device 20 can rapidly reduce the temperature of the substrate 14 and rapidly achieve the effect of making the contact surface between the substrate 14 and the carbon nanotube array 10 maintain the constant temperature. The cooling device 20 may be adhered to the surface of the substrate 14 away from the carbon nanotube array 10 through a thermal conductive adhesive.

So as to avoid the cooling device 20 to affect the reflection of the light, a cross-sectional area of the cooling device 20 is less than or equal to a cross-sectional area of the substrate 14 in a light irradiation direction of the light source. In one embodiment, the cross-sectional area of the cooling device 20 is the same as the cross-sectional area of the substrate 14 in the light irradiation direction of the light source to rapidly control and reduce the temperature of the substrate 14.

In step (S22), the substrate 14 is cooled by the cooling device 20 to make the contact surface between the substrate 14 and the carbon nanotube array 10 maintain the constant temperature. When the cooling device 20 is the device containing the cooling medium, the cooling medium is injected into the chamber through the inlet of the cooling device 20 and flows out of the outlet under a pressure to continuously circulate the cooling medium in the chamber. Thus, the cooling device 20 can keep a constant low temperature and continuously cool the substrate 14. When the cooling device 20 is the device containing the digital temperature control device, the substrate 14 may be cooled by precisely controlling a temperature of the digital temperature control device by a controller (for example, a computer), to make the contact surface between the substrate 14 and the carbon nanotube array 10 maintain the constant temperature.

In step (S22), a plurality of temperature sensors 15 can be located on the substrate 14. The plurality of temperature sensors 15 is used for sensing a temperature of the substrate 14 at different locations in real time. The plurality of temperature sensors 15 may be located on sidewalls of the substrate 14 in the axial direction of the carbon nanotubes 12 or may be located between the cooling device 20 and the substrate 14. In one embodiment, the plurality of temperature sensors 15 are located between the cooling device 20 and the substrate 14, and the cooling device 20 comprises a plurality of cooling units 21. The plurality of cooling units 21 may be in one-to-one correspondence with the plurality of temperature sensors 15 for controlling a temperature of a local location of the substrate 14. Further, the plurality of cooling units 21 and the plurality of temperature sensors 15 may have one to one correspondence. The larger the number of cooling units 21 and the temperature sensors 15, the better. When the temperature sensor 15 detects changes of the temperature at one location or some locations of the substrate 14, a temperature of the cooling medium in the cooling unit 21 corresponding to the temperature sensor 15 can be adjusted to maintain the temperature of the substrate 14 in a steady state. Thus, the contact surface between the substrate 14 and the carbon nanotube array 10 can be maintained at the constant temperature. The maintaining of the temperature of the substrate 14 in a stable state means that the temperature of the substrate 14 is substantially maintained within a small temperature fluctuation range.

In step (S23), the light source is disposed near the first end 122 of the carbon nanotube array 12 and away from the second end 124 of the carbon nanotube 12.

The light emitted by the light source may be various lights, such as an infrared light. In one embodiment, the light is a laser emitted from a carbon dioxide laser.

An irradiating angle of the light source can be selected according to need. The irradiating angle is the angle formed between a light beam 16 emitted from the light source and the first surface 102 of the carbon nanotube array 10. In one embodiment, the irradiating angle is 90 degrees such that the light beam 16 is substantially vertical to the first surface 102 of the carbon nanotube array 10 and parallel to an axis of each of the carbon nanotubes 12.

While irradiating the first surface 102 of the carbon nanotube array 10 with the light beam 16, the first surface 102 of the carbon nanotube array 10 absorbs photons from the light source and produces heat, due to carbon nanotube array 10 having an ideal black body structure. Thus, a temperature field distribution is proportional to a light intensity of the light source formed on the first surface 102 of the carbon nanotube array 10. The higher the light intensity of the light source, the more photons that are absorbed by the first surface 102 of the carbon nanotube array 10, and the more heat will be produced by the first surface 102. Each of the carbon nanotubes 12 has evidently heat conduction anisotropy. Heat is conducted along the axis of the carbon nanotube 12 and is hardly conducted along a direction vertical to the axis of the carbon nanotubes 12. Therefore, the heat of each of the carbon nanotubes 12 has been conducted along a direction from the first end 122 to the second end 124, until each of the carbon nanotubes 12 has equal and uniform heat. Meanwhile, the carbon nanotube array 10 radiates the visible light, due to carbon nanotube array 10 having an ideal black body structure. When the light source irradiates the substrate 14 and the carbon nanotube array 10, the substrate 14 absorbs the heat of the light source and transversally transfers the heat to affect the light intensity distribution. The heat transversally diffused and axially diffused in the substrate 14 can be reduced to make the contact surface between the substrate 14 and the carbon nanotube array 10 maintain the constant temperature by continuously cooling the substrate 14. Thus, the heat of the light source is conducted and radiated to the reflector 30 almost only along the axial direction of the carbon nanotube 12, and a accuracy of the light intensity distribution is improved.

In detail, when the light beam 16 irradiates the first surface 102 of the carbon nanotube array 10, for example, a light with a higher light intensity in the light beam 16 irradiates a first end 122 of a carbon nanotube 12A. The first end 122 of the carbon nanotube 12A absorbs photons from the light source and produces more heat. The heat is conducted along the direction from the first end 122 to the second end 124, until the carbon nanotube 12A has equal and uniform heat. A light with a lower light intensity in the light beam 16 irradiates a first end 122 of a carbon nanotube 12B. The first end 122 of the carbon nanotube 12B absorbs photons from the light source and produces less heat. The heat is conducted along the direction from the first end 122 to the second end 124, until the carbon nanotube 12B has equal and uniform heat. Heat of the carbon nanotube 12A is more than heat of the carbon nanotube 12B. Meanwhile, the carbon nanotubes 12A and 12B radiate the visible lights, due to the carbon nanotubes 12 having an ideal black body structure. Therefore, a light intensity of the visible light radiated by the carbon nanotubes 12A is higher than a light intensity of the visible light radiated by the carbon nanotubes 12B.

The light intensity of the visible light radiated by each of the carbon nanotubes 12 in the carbon nanotube array 10 is related to the light intensity of the light source. The higher the light intensity of the visible light radiated by one of the carbon nanotubes 12, the more heat will be produced by the first end 122 of the one of the carbon nanotubes 12, the higher the light intensity of one light irradiating the first end 122 of the one of the carbon nanotubes 12.

The substrate 14 is made of silicon, which is opaque. The second surface 104 of the carbon nanotube array 10 connects to the substrate 14. Therefore, the visible light radiated by the second of the carbon nanotube array 10 is turned back by the substrate 14.

In step (S24), the visible light from the carbon nanotube array 10 irradiates the reflector 30, and is reflected by the reflector 30 to the imaging element 40. A center of the first surface 102 of the carbon nanotube array 10 is located in a focus of the reflector 30.

A curvature radius of the reflector 30 can be in a range from about 10 mm to about 100 mm, to obtain more light. In one embodiment, the curvature radius of the reflector 30 is 88 mm, an object aperture angle of the reflector 30 is greater than or equal to 22.5 degrees, a numerical aperture of the reflector 30 is greater than 0.38. In not affecting aberration case, the distance between the reflector 30 and the carbon nanotube array 10 can be less than 80 mm, allowing the first surface 102 to be irradiated by more light.

In step (S25), after imaging the visible light reflected by the reflector 30 with the imaging element 40, the light intensity distribution of the light source can be obtained by reading the imaging element 40. A computer can be used for reading the imaging element 40 to obtain the light intensity distribution of the light source.

The position of the imaging element 40 is not limited as long as the visible light reflected by the reflector 30 can be received. In one embodiment, the imaging element 40 and the reflector 30 are respectively located on and spaced from two sides of the carbon nanotube array 10. The carbon nanotube array 10 is located between the substrate 14 and the reflector 30. The substrate 14 is located between the cooling device 20 and the carbon nanotube array 10. The cooling device 20 is located between the substrate 14 and the imaging element 40.

A size of the imaging element 40 is related to the curvature radius of the reflector 30. In one embodiment, the size of the imaging element 40 is ⅓ inch, a height of the image is 3.8 mm. A field region is less than 0.01 mm, a diameter of a image defocused spot is less than 0.01 mm. The method for measuring light intensity distribution can distinguish detail which has a size of greater than or equal to 10 microns.

The type of the imaging element 40 is not limited as long as the visible light radiated from the carbon nanotube array 10 can be imaged. The imaging element 40 can be a charge-coupled device (CCD), a complementary metal-oxide-semiconductor (CMOS). In one embodiment, the imaging element 40 is a CCD, a size of a picture element of the CCD is less than 10 microns.

The carbon nanotube arrays is used as a sensing element of the light intensity distribution. The carbon nanotubes is an excellent heat-sensitive and photosensitive material, and has a wide wavelength response range and a high absorption rate for light, especially infrared light. Therefore, the system for measuring light intensity distribution and the method for measuring light intensity distribution provided have high sensitivity, and a wide range of wavelengths of light can be measured. The cooling device absorbs and removes the heat of the substrate during cooling the substrate. The heat transversally diffused and axially diffused in the substrate can be reduced to make the contact surface between the substrate and the carbon nanotube array maintain the constant temperature. The heat of the light source is conducted and radiated to the reflector almost only along the axial direction of the carbon nanotube. Therefore, the system for measuring the light intensity distribution has higher sensitive and resolution, and can distinguish detail, which has a size of greater than or equal to 10 microns. Moreover, the system for measuring the light intensity distribution is simple and easy to operate, and can be at room temperature.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A system for measuring light intensity distribution, comprising:
    a substrate having a surface;
    a carbon nanotube array located on the surface of the substrate, wherein the carbon nanotube array is configured to absorb photons from a light source and radiate a visible light;
    a reflector spaced from the carbon nanotube array and configured to reflect the visible light; and
    an imaging element configured to image the visible light reflected by the reflector; and
    a cooling device configured to cool the substrate to make a contact surface between the substrate and the carbon nanotube array maintain a constant temperature, wherein the cooling device is located between the substrate and the imaging device, and the imaging device is spaced from the cooling device.

2. The system of claim 1, wherein the cooling device is located on a substrate surface away from the carbon nanotube array.

3. The system of claim 1, wherein a cooling device cross-sectional area is less than or equal to a substrate cross-sectional area in a light irradiation direction of the light source.

4. The system of claim 1, wherein the cooling device comprises the cooling medium, and the cooling medium is a cooling liquid or a cooling gas.

5. The system of claim 1, further comprising a plurality of temperature sensors, wherein the plurality of temperature sensors is located between the cooling device and the substrate.

6. The system of claim 5, wherein the cooling device comprises a plurality of cooling units, and the plurality of cooling units correspondence with the plurality of temperature sensors in a one-to-one manner.

7. The system of claim 1, wherein the cooling device is a digital temperature control device.

8. The system of claim 1, wherein the carbon nanotube array comprises a plurality of carbon nanotubes parallel to each other.

9. The system of claim 8, wherein angles between the plurality of carbon nanotubes and the surface of the substrate are in a range from about 10 degrees to about 90 degrees.

10. The system of claim 9, wherein the plurality of carbon nanotubes are perpendicular to the surface of the substrate.

11. The system of claim 1, wherein the carbon nanotube array comprises a first surface and a second surface opposite to the first surface, and the second surface connects to the surface of the substrate.

12. The system of claim 11, wherein a center of the first surface of the carbon nanotube array is located at a focus point of the reflector.

13. The system of claim 1, wherein a distance between the reflector and the carbon nanotube array is less than 80 millimeters.

14. The system of claim 1, wherein the substrate is a silicon substrate.

15. The system of claim 1, wherein the imaging element is a charge-coupled device (CCD) or a complementary metal-oxide-semiconductor (CMOS).

* * * * *